United States Patent
Kobayashi

(10) Patent No.: US 7,474,238 B2
(45) Date of Patent: Jan. 6, 2009

(54) ANALOG-TO-DIGITAL CONVERTER

(75) Inventor: Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/700,130

(22) Filed: Jan. 31, 2007

(65) Prior Publication Data

US 2007/0176818 A1 Aug. 2, 2007

(30) Foreign Application Priority Data

Jan. 31, 2006 (JP) ............................... 2006-022494

(51) Int. Cl.
*H03M 1/10* (2006.01)

(52) U.S. Cl. ..................... 341/118; 341/160; 341/162; 341/163

(58) Field of Classification Search ................. 341/118, 341/120, 155, 156, 158, 159, 161, 162, 163, 341/94

See application file for complete search history.

(56) References Cited

U.S. PATENT DOCUMENTS

| 4,639,715 | A | * | 1/1987 | Doluca | 341/120 |
| 5,877,720 | A | * | 3/1999 | Setty et al. | 341/159 |
| 6,014,097 | A | * | 1/2000 | Brandt | 341/156 |
| 7,098,834 | B2 | * | 8/2006 | Linder et al. | 341/155 |

FOREIGN PATENT DOCUMENTS

| JP | 61270919 A | * | 12/1986 |
| JP | 9-275342 A | | 10/1997 |

* cited by examiner

*Primary Examiner*—Howard Williams
(74) *Attorney, Agent, or Firm*—McDermott Will & Emery LLP

(57) ABSTRACT

An A-D converter includes a group of resistors, a group of comparators, an encoder and an output unit. The output unit includes a correction circuit. An inverter constitutes the correction circuit. The encoder is shared in a case where the A-D converter converts an inputted analog signal to a two-bit binary code and a case where the A-D converter converts the inputted analog signal to a 4-bit binary code. The correction circuit corrects the output of the encoder when the A-D converter is to convert the inputted analog signal to the 2-bit binary code.

3 Claims, 9 Drawing Sheets

ANALOG-TO-DIGITAL CONVERTER

BACKGROUND OF THE INVENTION

1. Field of the Invention

The present invention generally relates to analog-to-digital converters and it particularly relates to an analog-to-digital converter in which the input analog signal is compared with a reference signal by a plurality of comparators provided in parallel.

2. Description of the Related Art

As an example of a circuit for converting the inputted analog signals into the digital signals, there is available a pipeline-type A-D converter. A pipeline-type A-D converter is configured such that sub-A-D converters of low bits are connected in a plurality of stages. The inputted analog signal is A-D converted in stages through the respective sub-A-D converters. Each sub-A-D converter is provided with a plurality of comparators, and each comparator compares the inputted analog signal with the reference voltage so as to convert the analog signal into the digital signals.

The digital signals obtained after the input analog signal has been compared with the reference voltage are converted to the binary codes by the encoder. The structure of the encoder is determined according to the number of bits used to represent the binary code to be produced. In other words, if the numbers of bits in the binary code to be produced differ, the structure of the encoders will also differ. Thus, even if a circuit that compares an input analog signal with a reference voltage is shared when two binary codes having different numbers of bits are generated, two encoders need to be provided. This inhibits the reduction in circuit scale of an analog-to-digital converter.

SUMMARY OF THE INVENTION

The present invention has been made in recognition of the aforementioned circumstances and a general purpose thereof is to reduce the circuit scale of an analog-to-digital converter.

In order to resolve the above problems, an analog-to-digital converter according to one embodiment of the present invention is a converter which converts an input analog signal to a digital value of a predetermined number of bits, and it comprises: a plurality of comparators which each compares the input analog signal with a predetermined reference voltage; an encoder which converts outputs of the plurality of comparators to digital values; and a correction circuit which corrects an output of the encoder, if necessary, according to a condition under which the analog-to-digital converter is used.

Another embodiment of the present invention relates also to an analog-to-digital converter. This analog-to-digital converter is an analog-to-digital converter which converts an input analog signal to a digital value of a first number of bits, and it comprises: a plurality of comparators, arranged in parallel, which each compares the input analog signal with a predetermined reference voltage wherein the number of comparators is determined based on the first number of bits; an encoder which converts outputs of the plurality of comparators to digital values of the first number of bits; and an output unit which outputs the digital values converted by the encoder. When the analog-to-digital converter is to convert the input analog signal to a digital value of a second number of bits which is less than the first number of bits, the output unit corrects the digital value converted by the encoder to the digital value of the second number of bits that the analog-to-digital converter is to generate.

Still another embodiment of the present invention relates also to an analog-to-digital converter. This analog-to-digital converter comprises: a plurality of comparators which each compares an input analog signal with a predetermined reference voltage; an encoder which converts outputs of the plurality of comparators to digital values wherein the encoder is configured in response to a case where the analog signal and the predetermined reference voltage are inputted to the plurality of comparators, respectively, under a first scheme; and a correction circuit which corrects the digital values converted by the encoder, in a case where the analog signal and the predetermined reference voltage are inputted to the plurality of comparators, respectively, under a second scheme that differs from the first scheme.

It is to be noted that any arbitrary combination of the above-described structural components and expressions converted among a method, an apparatus, a system and so forth are all effective as and encompassed by the present embodiments.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
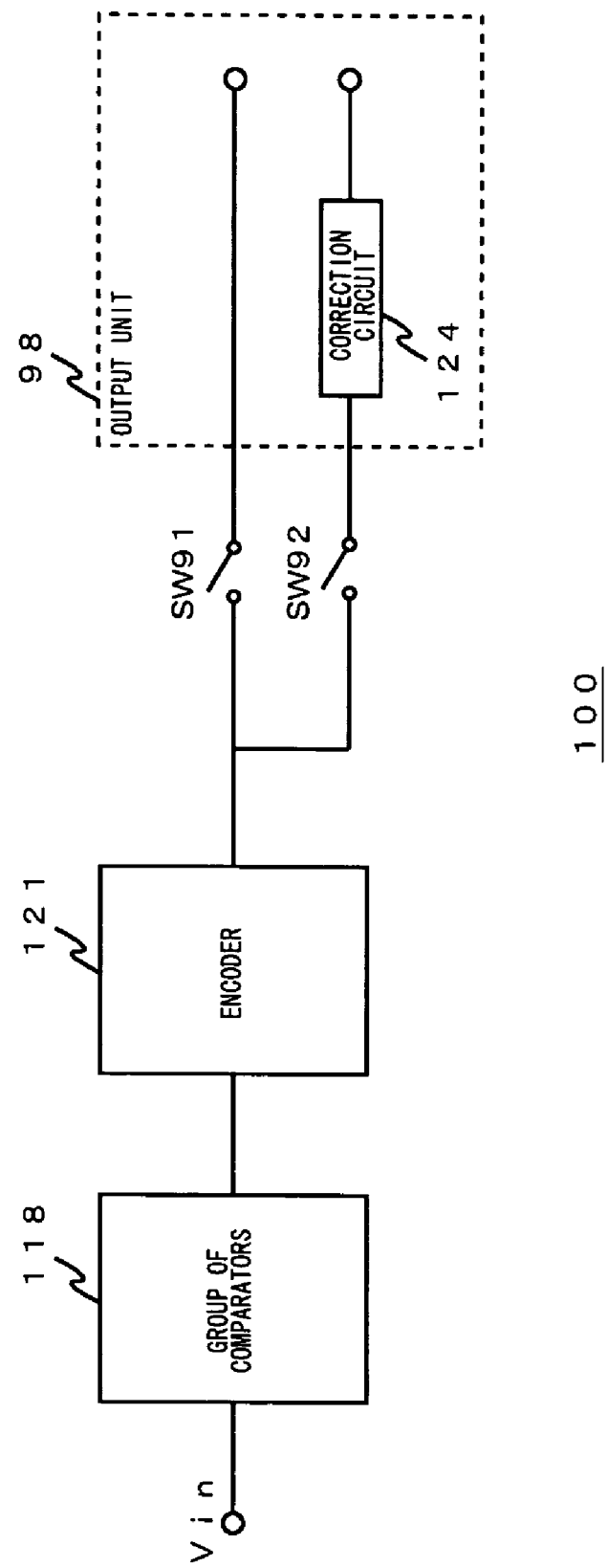
FIG. 1 is a schematic diagram showing an outline of a structure for an A-D converter according to a first embodiment of the present invention.

The invention will now be described by reference to the preferred embodiments. This does not intend to limit the scope of the present invention, but to exemplify the invention.

A preferred embodiment according to the present invention relates to an analog-to-digital converter (hereinafter referred to as "A-D converter") which compares an input analog signal with a reference voltage and converts the input analog signal into a digital value. A basic configuration of this A-D converter is such that the input analog signal is converted to a digital value having a first number of bits. If the A-D converter is supposed to convert the input analog signal to a digital value having a second number of bits which is less than the first number of bits, the digital value of the first number of bits obtained from an encoder as a result of comparison with the reference voltage will be corrected to the digital value of the second number of bits that the A-D converter is supposed to produce. Thereby, it is possible to share the encoder both in a case where the A-D converter is to convert the input analog signal to a digital value of the first number of bits and a case where the A-D converter is to convert the input analog signal to a digital value having the second number of bits. Hence, compared with a case where two encoders need to be provided as in the aforementioned two cases, the circuit scale of an A-D converter can be reduced.

OUTLINE OF THE EMBODIMENT

An analog-to-digital converter according to one preferred embodiment of the present invention is a converter which converts an input analog signal to a digital value of a predetermined number of bits, and it comprises: a plurality of comparators which each compares the input analog signal with a predetermined reference voltage; an encoder which converts outputs of the plurality of comparators to digital values; and a correction circuit which corrects an output of the encoder, if necessary, according to a condition under which the analog-to-digital converter is used A "condition under which the analog-to-digital converter is used" is determined by the number of bits of a digital value to be produced by the analog-to-digital converter or a scheme in which the signals are inputted to the comparator, for example. According to this embodiment, the provision of the correction circuit enables the sharing of the encoder even if the condition under which the analog-to-digital converter is used differs. Hence the circuit scale of the analog-to-digital converter can be reduced.

Another preferred embodiment of the present invention relates also to an analog-to-digital converter. This analog-to-digital converter is an analog-to-digital converter which converts an input analog signal to a digital value of a first number of bits, and it comprises: a plurality of comparators, arranged in parallel, which each compares the input analog signal with a predetermined reference voltage wherein the number of comparators is determined based on the first number of bits; an encoder which converts outputs of the plurality of comparators to digital values of the first number of bits; and an output unit which outputs the digital values converted by the encoder. When the analog-to-digital converter is to convert the input analog signal to a digital value of a second number of bits which is less than the first number of bits, the output unit corrects the digital value converted by the encoder to the digital value of the second number of bits that the analog-to-digital converter is to generate.

According to this embodiment, the output unit has a function of correcting the digital values converted by the encoder. Thus the encoder can be put to a common use in both performing a conversion to a digital value of the first number of bits and performing a conversion to a digital value of the second number of bits. Accordingly, the circuit scale of the analog-to-digital converter can be reduced.

The first number of bits may be four, the second number of bits may be two, and the output unit may include an inverter which inverts a lower second bit in the digital value converted by the encoder. The output unit may output an output of the inverter and a value of the least significant bit in the digital value converted by the encoder, as the digital value of the second number of bits to be generated by the analog-to-digital converter. In this case, a structure required to correct the digital value converted by the encoder to the digital value of the second number of bits that the analog-to-digital converter is to generate, can be realized by a single inverter. Thereby, the circuit scale of the analog-to-digital converter can be reduced.

Still another preferred embodiment of the present invention relates also to an analog-to-digital converter. This analog-to-digital converter comprises: a plurality of comparators which each compares an input analog signal with a predetermined reference voltage; an encoder which converts outputs of the plurality of comparators to digital values wherein the encoder is configured in response to a case where the analog signal and the predetermined reference voltage are inputted to the plurality of comparators, respectively, under a first scheme; and a correction circuit which corrects the digital values converted by the encoder, in a case where the analog signal and the predetermined reference voltage are inputted to the plurality of comparators, respectively, under a second scheme that differs from the first scheme.

According to this embodiment, the provision of the correction circuit enables the sharing of the encoder when the scheme differs in which the analog signal and the reference voltages are inputted to the plurality of comparators, respectively. As a result, the circuit scale of the analog-to-digital converter can be reduced.

The levels of the respective outputs in the plurality of comparators may be inverted between in a case where the analog signal and the predetermined reference voltage are inputted under the first scheme and a case where the analog signal and the predetermined reference voltage are inputted under the second scheme. The correction circuit may include an inverter which inverts the digital values converted by the encoder. In such a case, the correction circuit can be realized by a simple configuration, so that the circuit scale of the analog-to-digital converter can be reduced.

FIRST EMBODIMENT

FIG. 1 is a schematic diagram showing an outline of a structure for an A-D converter 100 according to a first embodiment. The A-D converter 100 is configured on the assumption that an input analog signal is converted to a binary code of n bits. The A-D converter 100 principally includes a group of comparators 118, an encoder 121 and an output unit 98. The output unit 98 includes a correction circuit 124.

The group of comparators 118 is structured by a plurality of comparators arranged in parallel. In the group of comparators 118, the input analog signal is compared with a reference voltage and then the comparison result is outputted to the encoder 121. The encoder 121 converts the comparison result in the group of comparators 118 into a binary code of n bits. The encoder 121 is comprised of a ROM (Read Only Memory), for instance. The binary code of n bits outputted from the encoder 121 is outputted to the output unit 98 via a switch SW91 or a switch SW92. The switch SW91 and the switch SW92 are turned on and off exclusively.

The switch SW91 is turned on in the case when the A-D converter 100 is to convert the input analog signal Vin to a binary code of n bits. The switch SW92 is turned on in the case when the A-D converter 100 is to convert the input analog signal Vin to a binary code of m bits where m satisfies m<n. The switch SW92 may operate in a manner that only the part of the binary code of n bits, outputted from the encoder 121, which is to be used in the correction circuit 124 is inputted to the correction circuit 124.

The output unit 98 outputs the binary code of n bits inputted via the switch SW91 as it is intact. On the other hand, the binary code inputted via the switch SW92 is outputted from the output unit 98 after the binary code has been corrected, by the correction circuit 124, to a binary code of m bits which is to be produced in the A-D converter 100. A description will be given hereunder as n=4 and m=2.

Figure 2:
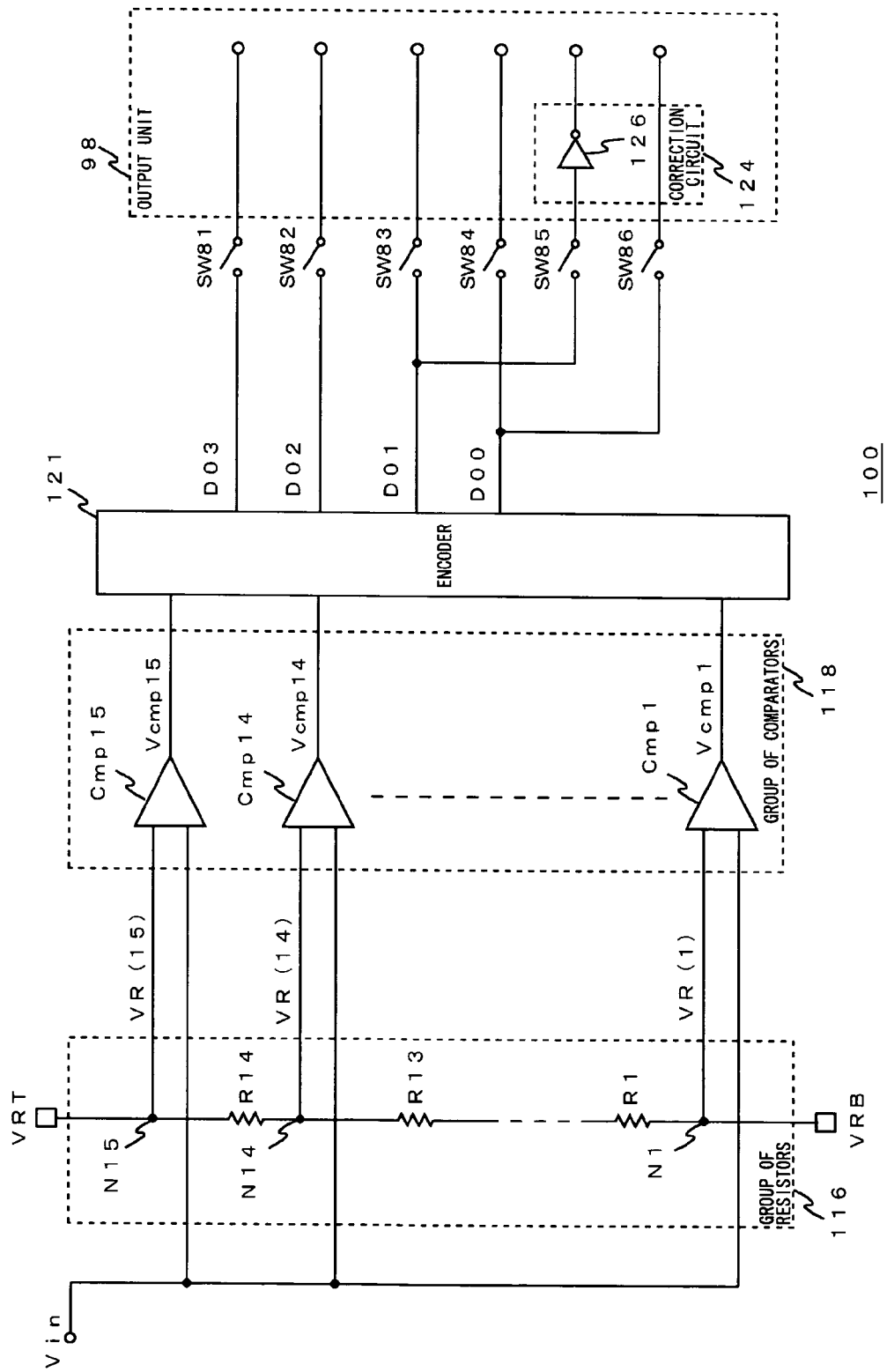
FIG. 2 is a general view showing a structure of the A-D converter shown in FIG. 1.

FIG. 2 is a general view showing a structure of the A-D converter 100 shown in FIG. 1. The A-D converter 100 shown in FIG. 2 is of a flash type where comparators are all connected in parallel. In FIG. 2, components identical or similar to those in FIG. 1 are given the same or like reference numerals as those of FIG. 1, and the explanation thereof will be omitted as appropriate. In FIG. 2, the analog signal Vin and the reference voltage are one of the differential inputs, and the other thereof is omitted here.

The A-D converter 100 is comprised of a group of resistors 116, a group of comparators 118, an encoder 121, and an output unit 98. The group of resistors 116 is comprised of fourteen resistors R1 to R14 connected in series between a terminal of high-potential-side reference voltage VRT and a terminal of low-potential-side reference voltage VRB. The group of comparators 118 is comprised of fifteen comparators Cmp1 to Cmp15 arranged in parallel. The output unit 98 includes a correction circuit 124. The correction circuit 124 is comprised of an inverter 126.

Nodes in the low-potential sides of the resistors R1 to R14 are denoted by N1 to N14. A node in the high-potential side of the resistor R14 is denoted by N15. Potentials VR(1) to VR(15) of the nodes N1 to N15 are reference voltages of the comparators Cmp1 to Cmp15, respectively. The resistors R1 to R14 each has the same resistance value. Thus, the reference voltages VR(1) to VR(15) are fifteen reference voltages having the intervals of equal potential.

The analog signal Vin is inputted to the noninverting input terminals of the comparators Cmp1 to Cmp15. The reference voltages VR(1) to VR(15), which are potentials of the nodes N1 to N15, are inputted to the inverting input terminals of the comparators Cmp1 to Cmp15, respectively. Hence, if the analog signal Vin is greater than the reference voltages VR(1) to VR(15), respectively, the output signals Vcmp1 to Vcmp15 of the comparators Cmp1 to Cmp15 will be high levels. Conversely, if the analog signal Vin is less than the reference voltages VR(1) to VR(15), respectively, the output signals Vcmp1 to Vcmp15 of the comparators Cmp1 to Cmp15 will be low levels.

The outputs Vcmp1 to Vcmp15 of the comparators Cmp1 to Cmp15 are inputted to the encoder 121. The encoder 121 converts the inputted signal to a binary code of 4 bits (D03 to D00). The binary code of 4 bits (D03 to D00) outputted from the encoder 121 is outputted to the output unit 98 via switches SW81 to SW84. Alternatively, the lower 2 bits (D01 and D00) of the 4-bit binary code (D03 to D00) may be outputted to the output unit 98 via a switch SW85 and a switch SW86.

The switches SW81 to SW84 correspond to the switch SW91 of FIG. 1. The switch SW85 and the switch SW86 correspond to the switch SW92 of FIG. 1. If the A-D converter 100 is to convert the input analog signal Vin to a binary code of 4 bits, the switches SW81 to SW84 will be turned on and the switch SW85 and the switch SW86 will be turned off. If the A-D converter 100 is to convert the input analog signal Vin to a binary code of 2 bits, the switch SW85 and the switch SW86 will be turned on and the switches SW81 to 84 will be turned off.

The output unit 98 outputs, as they are intact, the binary code of 4 bits (D03 to D00) inputted via the switches SW81 to SW84. On the other hand, the output unit 98 has the lower 2 bits (D01 and D00) of the binary code (which were inputted by the switch SW85 and the switch SW86) corrected by the correction circuit 124 and then outputs the corrected binary code. In the case of FIG. 2, the correction circuit 124 is comprised of an inverter 126 connected with the switch SW85. Thus, the output unit 98 inverts the binary code (D01) inputted via the switch SW85 and then outputs the inverted binary code. And the output unit 98 outputs the binary code (D00) inputted via the switch SW86, without any modification or alteration. That is, the binary code (D00) inputted via the switch SW86 is outputted intact.

Figure 3:
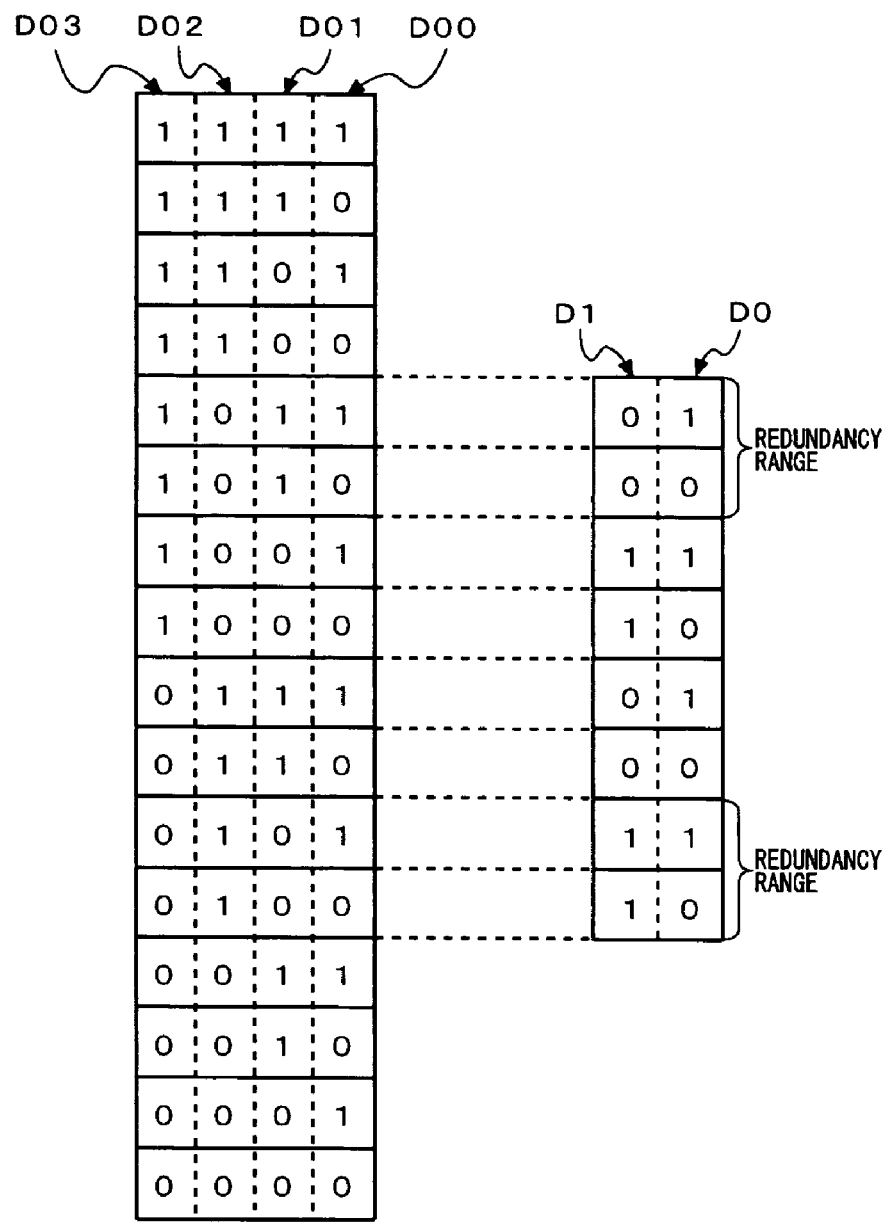
FIG. 3 illustrates a correspondence between a 4-bit binary code (D03 to D00) outputted from an encoder shown in FIG. 2 and a 2-bit binary code (D1 and D0) in the case when the A-D converter shown in FIG. 2 is to generate said 2-bit binary code.

A description is now given of correction in the correction circuit 124. FIG. 3 illustrates a correspondence between a 4-bit binary code (D03 to D00) outputted from the encoder 121 of FIG. 2 and a 2-bit binary code (D1 and D0) in the case when the A-D converter 100 of FIG. 2 is to generate said 2-bit binary code. In FIG. 3, the binary code of D03 to D00 at the bottom is the output of the encoder 121 when the output of all comparators in the group of comparators 118 of FIG. 2 was low level. The i-th binary codes of D03 to D00 (2<i<15) from the bottom represent outputs of the encoder 121 when, of the group of comparators 118 of FIG. 2, the outputs Vcmp1 to Vcmp(i−1) of the comparators Cmp1 to Cmp(i−1) were high levels and the outputs Vcmpi to Vcmp15 of the comparators Cmpi to Cmp15 were low levels. The binary code of D03 to D00 on the top is the output of the encoder 121 when the output of all comparators in the group of comparators 118 of FIG. 2 was high level.

In the first embodiment, when the A-D converter 100 converts the inputted analog signal Vin to a 2-bit binary code, it uses comparators Cmp5 to Cmp11 out of the comparators Cmp1 to Cmp15 in the group of comparators 118 of FIG. 2. Thus, among sixteen ($2^4$) 4-bit binary codes (D03 to D00), those from the fifth to the twelfth binary codes from the bottom are to be corrected.

Referring to FIG. 3, one sees that D00 in the 4-bit binary code (D03 to D00) outputted from the encoder 121 may be outputted directly as D0 in the 2-bit binary code (D1 and D0) that the A-D converter 100 should generate. Also, it can be seen that if D01 in the 4-bit binary code (D03 to D00) is inverted, D1 in the 2-bit binary code (D1 and D0) to be generated by the A-D converter 100 is obtained. Thus, as shown in FIG. 2, the correction circuit 124 can be configured by the inverter 126 alone, provided on a path for D01 outputted from the encoder 121. Note that, among D1's and D0's shown in FIG. 3, two of them from the top thereof and two of them from the bottom thereof are redundancy ranges. The redundancy range is provided for the correction of a conversion result of higher bits in the case where a structure as shown in FIG. 2 is included in an A-D converter of pipeline type, for instance. If no such correction is necessary, there is no need of providing the redundancy range.

According to the first embodiment, the correction circuit 124 is provided in the output unit 98. Hence, the encoder 121 can be put to a common use in a case where the A-D converter 100 should convert the inputted analog signal Vin to 4-bit binary codes and a case where the A-D converter 100 should convert the inputted analog signal Vin to 2-bit binary codes. As shown in FIG. 2, the correction circuit 124 can be configured by the inverter 126 alone, for instance. Thus, the circuit scale of the A-D converter 100 can be reduced as compared to the case where there are provided encoders separately for the above two cases.

Figure 4:
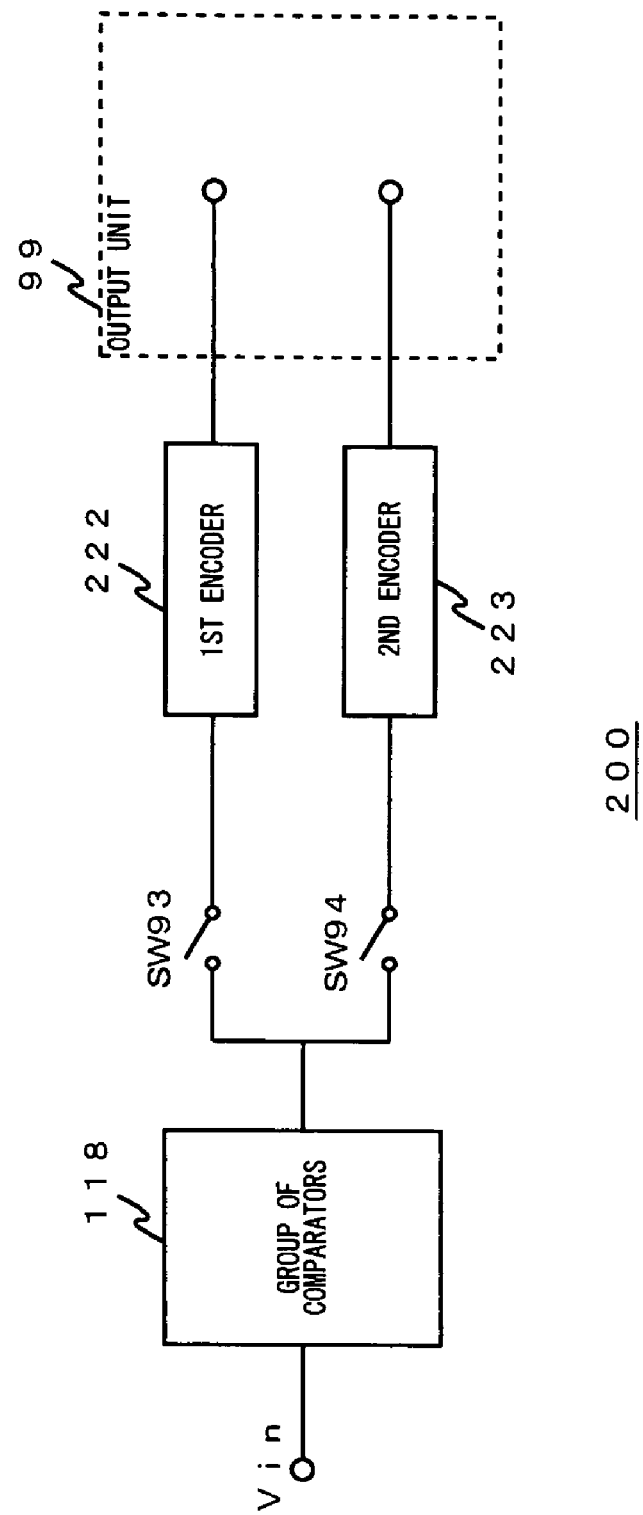
FIG. 4 is a schematic diagram showing an outline of a structure for an A-D converter according to a comparative example.

To clarify the effects of the first embodiment, a brief description is given now of an A-D converter where two encoders are provided to generate binary codes having two different kinds of numbers of bits. FIG. 4 is a schematic diagram showing an outline of a structure for an A-D converter 200 according to a comparative example. The structure of the A-D converter 200 differs from that of the A-D converter shown in FIG. 1 in that there are provided the first encoder 222 for producing 4-bit binary codes and the second encoder 223 for producing 2-bit binary codes. On the other hand, no correction circuit is provided in the output unit 99. The second encoder 223 requires a larger circuit scale as compared with the correction circuit 124 shown in FIG. 1. Since by employing the structure realized in FIG. 2 the correction circuit 124 can be configured by the inverter 126 alone, the advantageous effect of reducing the circuit scale according to the present embodiment is obviously significant over this comparative example.

SECOND EMBODIMENT

Figure 5:
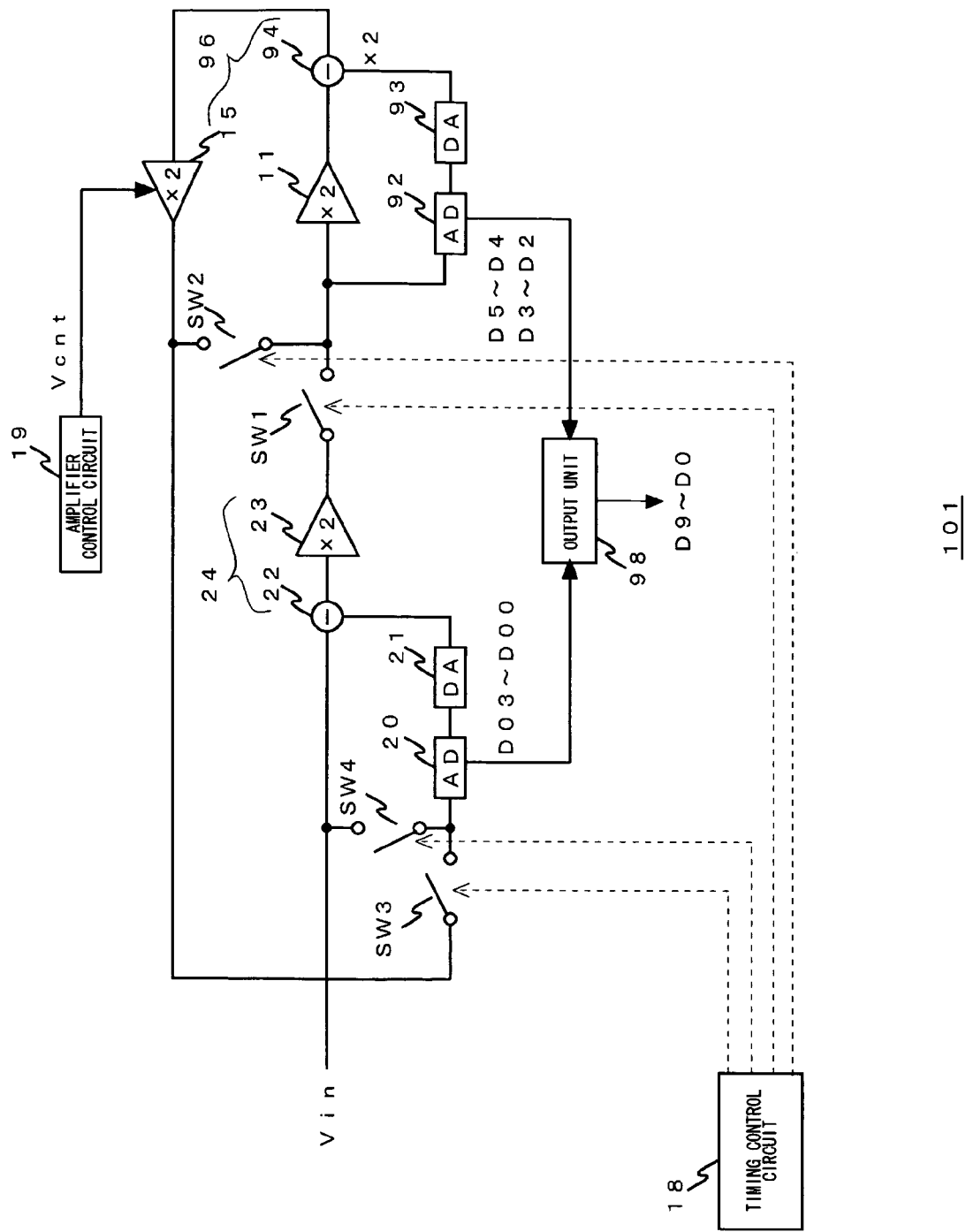
FIG. 5 illustrates a structure of an A-D converter according to a second embodiment of the present invention.

In a second embodiment of the present invention, a description will be given of a case where the structure of the first embodiment shown in FIG. 2 is installed in an A-D converter in which the inputted analog signal is converted to a digital value in a plurality of steps and stages. FIG. 5 illustrates a structure of an A-D converter 101 according to a second embodiment of the present invention. In FIG. 5, components identical or similar to those in FIG. 2 are given the same or like reference numerals as those of FIG. 2, and the explanation thereof will be omitted as appropriate.

The A-D converter 101 includes a third switch SW3, a fourth switch SW4, a second A-D converter circuit 20, a second D-A converter circuit 21, a second subtraction circuit 22, a third amplifier circuit 23, a first switch SW1, a second switch SW2, a first amplifier circuit 11, a first A-D converter circuit 92, a first D-A converter circuit 93, a first subtraction circuit 94, a second amplifier circuit 15, a timing control circuit 18, an amplifier control circuit 19, and an output unit 98. Of the components shown in FIG. 2, the group of resistors 16, the group of comparators 118 and the encoder 121 are included in the second A-D converter circuit 20.

In the A-D converter 101, an analog signal Vin is inputted to the second A-D converter circuit 20 via the fourth switch SW4. The second A-D converter circuit 20 compares the inputted analog signal with a reference voltage and then output a digital value resulting from this comparison to the second D-A converter circuit 21. The second A-D converter circuit 20 also converts the digital value of the comparison result to a 4-bit binary code so as to be outputted to the output unit 98. The second D-A converter circuit 21 converts the digital value outputted from the second A-D converter circuit 20 to an analog signal.

The second subtraction circuit 22 subtracts the output of the second D-A converter circuit 21 from the analog signal Vin. The third amplifier circuit 23 amplifies the output of the second subtraction circuit 22. The output of the third amplifier circuit 23 is outputted, via the first switch SW1, to the first amplifier circuit 11 and the first A-D converter circuit 92. The gain of the third amplifier circuit 23 is 2×. Note that a second subtractor-amplifier circuit 24, which is an amplifier circuit provided with a subtraction function, may be used in place of the second subtraction circuit 22 and the third amplifier circuit 23. Also, a sample-and-hold circuit may be inserted anterior to the second subtraction circuit 22. In the example of FIG. 5, the subtraction is performed by adjusting the timing of input to the second subtractor-amplifier circuit 24.

The first A-D converter circuit 92 compares the input analog signal with a reference voltage and outputs a digital value resulting from the comparison to the first D-A converter circuit 93. The first A-D converter circuit 92 converts the digital value of the comparison result to a 2-bit binary code and outputs it to the output unit 98. The first D-A converter circuit 93 converts the digital value outputted from the first A-D converter circuit 92 to an analog signal. Here, the analog value outputted from the first D-A converter circuit 93 is amplified by a factor of 2 in accordance with the gain of the first amplifier circuit 11.

The first amplifier circuit 11 samples the inputted analog signal and holds it and then amplifies it by a factor of 2 and outputs the amplified signal to the first subtraction circuit 94. The first subtraction circuit 94 subtracts the analog value outputted from the first D-A converter circuit 93, from the analog value outputted from the first amplifier circuit 11. The second amplifier circuit 15 amplifies the output of the first subtraction circuit 94. The gain of the second amplifier circuit 15 is controlled by an amplification control signal Vcnt outputted from the amplifier control circuit 19. The output of the second amplifier circuit 15 is fed back to the first amplifier circuit 11 and the first A-D converter circuit 92 via the second switch SW2. Or, the output of the second amplifier circuit 15 is fed back to the second A-D converter 20 via the third switch SW3. Note that a subtractor-amplifier circuit 96 which is an amplifier circuit having a subtraction function may be used in place of the first subtraction circuit 94 and the second amplifier circuit 15.

When the second amplifier circuit 15 feeds back the output to the first A-D converter circuit 92, the amplifier circuit 19 performs a control so that the gain of the second amplifier circuit 15 is 2×. When, on the other hand, the second amplifier circuit 15 feeds back the output to the second A-D converter circuit 20, the amplifier circuit 19 performs a control so that the gain of the second amplifier circuit 15 is 4×.

In the first step, which is the initial step of conversion, the fourth switch SW4 is turned on and the third switch SW3 is turned off. In the first step, the second A-D converter circuit 20 generates a 4-bit binary code (D03 to D00). This 4-bit binary code is outputted as values of the higher 1st to 4th bits (D9 to D6) among 10 bits that the A-D converter 101 will output finally. In the second step, the first switch SW1 is turned on and the second switch SW2 is turned off. In the second step, the first A-D converter circuit 92 generates the higher 5th and 6th bits (D5 and D4) among the 10 bits that the A-D converter 101 will output finally. In the third step, the second switch SW2 is turned on and the first switch SW1 is turned off. In the third step, the first A-D converter circuit 92 generates the higher 7th and 8th bits (D3 and D2) among the 10 bits that the A-D converter 101 will output finally. In the fourth step, the third switch SW3 is turned on and the fourth switch SW4 is turned off.

According to the second embodiment, in the fourth step the second A-D converter circuit 20 generates a 4-bit binary code (D03 to D00). As explained in conjunction with FIG. 2, this 4-bit binary code is corrected to the higher 9th and 10th bits (D1 and D0) in the 10-bit binary code that the A-D converter 101 will output finally, before it is outputted.

Figure 6:
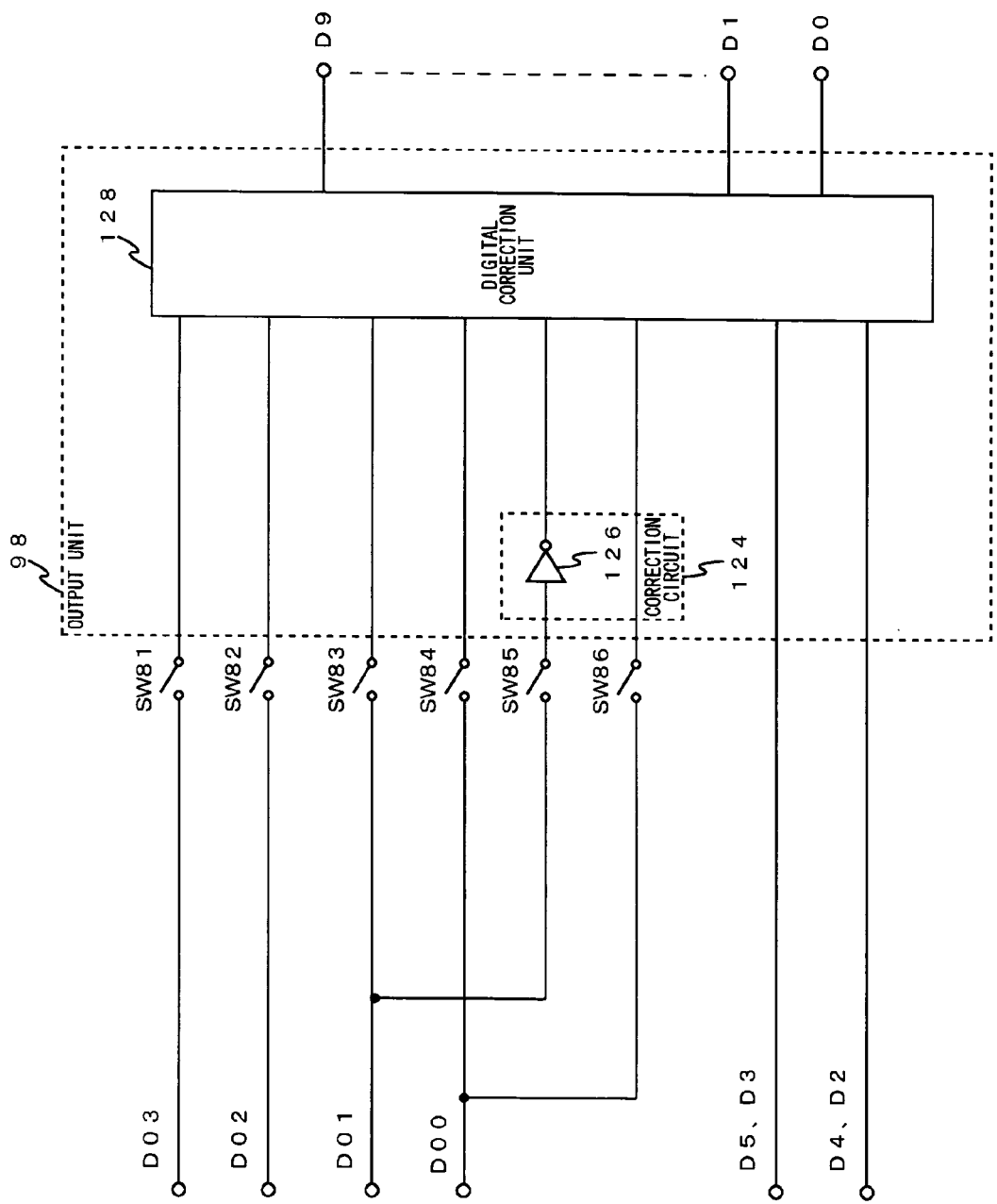
FIG. 6 illustrates a structure of an output unit shown in FIG. 5.

FIG. 6 illustrates a structure of the output unit 98. In FIG. 6, components identical or similar to those in FIG. 2 are given the same or like reference numerals as those of FIG. 2, and the explanation thereof will be omitted as appropriate. An output unit 98 includes a correction circuit 124 and a digital correction unit 128. The binary codes outputted sequentially from the first A-D converter circuit 92 and the second A-D converter circuit 20 shown in FIG. 5 are inputted to the digital correction unit 128. However, the binary codes of D3 to D00 that the second A-D converter circuit 20 of FIG. 5 has generated in the fourth step are corrected to the higher 9th and 10th bits (D1 and D0), in the correction circuit 124, among 10 bits that the A-D converter 101 will output finally and then they are inputted to the digital correction unit 128. The digital correction unit 128 corrects the inputted binary codes based on a redundancy range described later and then outputs the thus corrected binary codes (D9 to D0) in parallel.

Redundancy ranges are assigned in the conversion by the first A-D converter circuit 92 in the second and the third step and in the conversion by the second A-D converter circuit 20 in the fourth step. Thus, the result of conversion in the first to third steps can be corrected based on the result of conversion by the A-D conversion circuit in the second to fourth steps. The correction based on the redundancy range is a known technique and therefore the detailed description thereof is omitted here.

Figure 7:
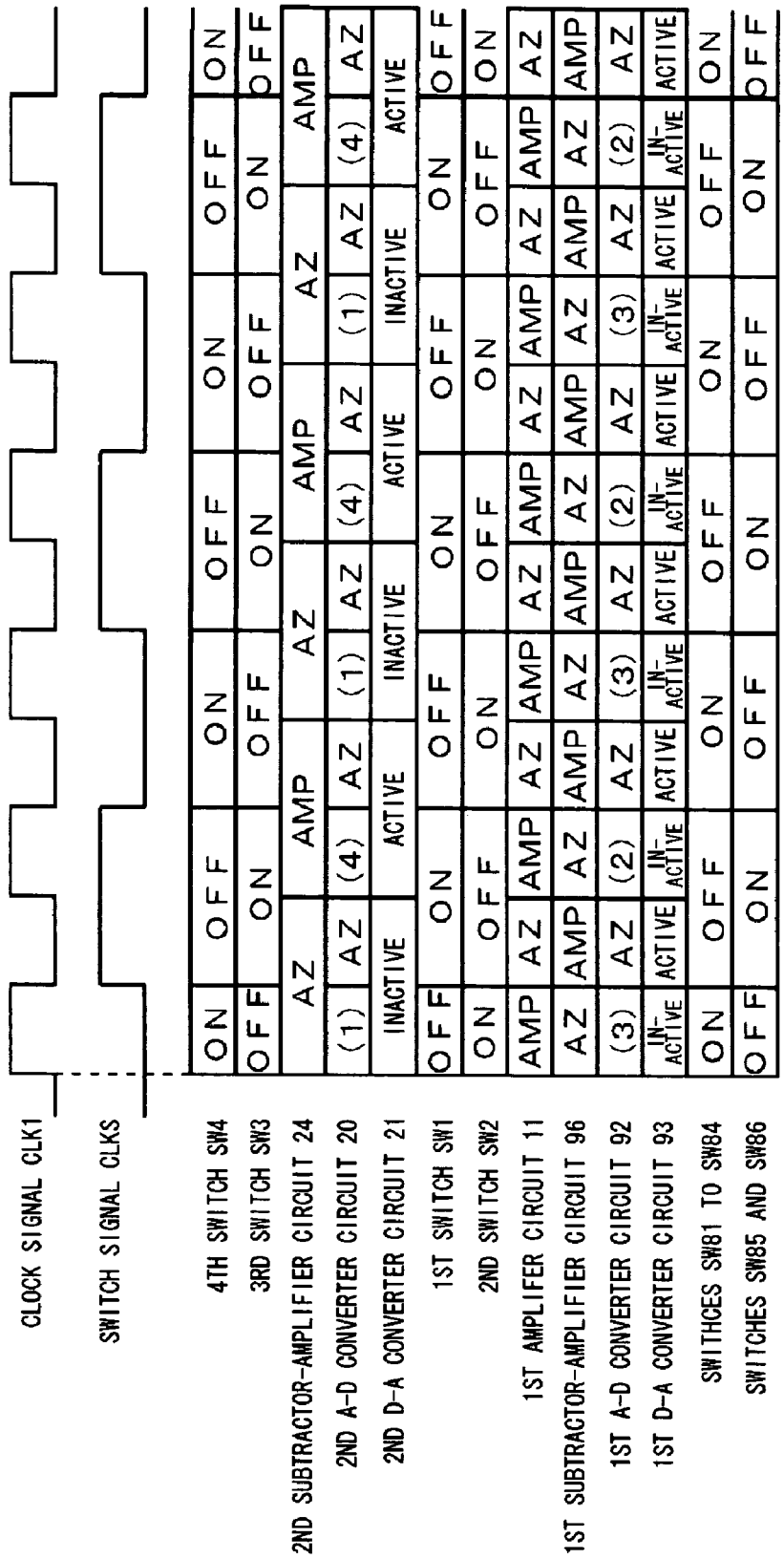
FIG. 7 is a timing chart illustrating an entire operation of the A-D converter shown in FIG. 5.

An operation of the A-D converter 101 structured as above will now be described. FIG. 7 is a timing chart illustrating an entire operation of the A-D converter 101 shown in FIG. 5. Two signal waveforms are a clock signal CLK1 and a switch signal CLKS. The clock signal CLK1 controls the operations of the first amplifier circuit 11, the first substractor-amplifier circuit 96, the first A-D converter circuit 92, the first D-A converter circuit 93, the second subtractor-amplifier circuit 24, the second A-D converter circuit 20, and the second D-A converter circuit 21. The switch signal CLKS controls the ON and OFF of the first switch SW1 to the fourth switch SW4 and the switches SW81 to SW86 of FIG. 6.

The first switch SW1, the third switch SW3 and the switches SW85 and SW86 of FIG. 6 are turned on when the switch signal CLKS is in a high level, whereas they are turned off when the switch signal CLKS is in a low level. The second switch SW2, the fourth switch SW4 and the switches SW81 to SW84 of FIG. 6 are turned on when the switch signal CLKS is in a low level, whereas they are turned off when the switch signal CLKS is in a high level.

Every time the clock signal CLK1 transits from a low level to a high level, the operation of amplifying the inputted analog signal and the autozero operation are switched therebetweeen in the second subtractor-amplifier circuit 24. The second A-D converter circuit 20 carries out a conversion operation and then outputs a digital value when the clock signal CLK1 is high, whereas it carries out an autozero operation when the clock signal CLK1 is low. Every time the clock signal CLK1 transits from a low level to a high level, the state in which the D-A conversion is executed and the indeterminate (inactive) state are switched therebetweeen in the second D-A converter circuit 21.

When the clock signal CLK1 is in a high level, the first amplifier circuit 11 amplifies an inputted analog signal and then outputs it to the subtraction circuit 14. When the clock signal CLK1 is in a low level, the first amplifier circuit 11 performs an autozero operation. The first subtractor-amplifier circuit 96 amplifiers the analog signal inputted when the clock signal CLK1 is in a low level. When the clock signal CLK1 is in a high level, the first subtractor-amplifier circuit 96 performs an autozero operation. When the clock signal CLK1 is in a high level, the first A-D converter circuit 92 performs a conversion operation so as to output a digital value, whereas when the clock signal CLK1 is in a low level, the first A-D converter circuit 92 performs an autozero operation. When the clock signal CLK1 is in a low level, the first D-A converter circuit 93 performs a D-A conversion, whereas when the clock signal CLK1 is in a high level, the first D-A converter circuit 93 becomes indeterminate or inactive.

The second embodiment achieves the same advantageous effects as with the first embodiment. That is, the provision of the correction circuit 124 in the output unit 98 makes it possible to share the encoder 121 both in a case when the second A-D converter circuit 20 is to generate a 4-bit binary code and in a case when the second A-D converter circuit 20 is to generate a 2-bit binary code. Since as shown in FIG. 6 the correction circuit 124 can be configured by the inverter 126 alone, the circuit scale can be reduced as compared to the case where two encoders are provided for the above two cases.

The embodiments described above are merely exemplary, and it is understood by those skilled in the art that various modifications to the combination of each component and process thereof are possible and such modifications are also within the scope of the present invention.

In the present embodiments, a description has been given of an example where the encoder 121 is put to a common use both in the case where the A-D converter is to generate a 4-bit binary code and in the case where it is to generate a 2-bit binary code. However, the number of bits that the A-D converter is to generate is not limited to 4 bits and 2 bits, and it may be an arbitrary number of bits. In such a case, the correction circuit is preferably designed, as appropriate, by referring to the correspondence as shown in FIG. 3. Thereby, the scope of application for the A-D converter according to the present embodiments is broadened and at the same time the degree of freedom in design is raised.

Also, the number of bits that the A-D converter is to use is not limited to the two kinds. If the correction circuit is provided in plurality, the encoder 121 can be shared even in the case where the A-D converter is to generate three or more kinds of the number of bits. In this case, too, the scope of application for the A-D converter according to the present embodiments is broadened and at the same time the degree of freedom in design is raised.

The present embodiments are not limited to the case where the encoder 121 is put to a common use when the A-D converter performs a conversion to the different number of bits. The present embodiments can also be applied to the case when it performs a conversion to the same number of bits. For example, the technique of the present embodiments can be applied to a case when the encoder is shared in a first type where the reference voltage is inputted to an inverting input terminal of a comparator and an analog signal to be converted is inputted to a noninverting input terminal of the comparator and a second type where the analog signal to be converted is inputted to an inverting input terminal and a reference voltage is inputted to a noninverting input terminal. Also, the technique of the present embodiments can be applied to a case when the encoder is shared in a first mode where an analog signal to be converted is sampled at the end of a non-operating period of the A-D converter and then the a reference voltage is received during a comparative operating period thereof and a second mode where a reference voltage is sampled at the end of a non-operating period and the analog signal to be converted is received during a comparative operating period thereof. In generalization, the technique of the present embodiments can be applied to a case when the encoder is shared in a first scheme where the output of a comparator indicates a high level if the level of an analog signal to be converted is greater than the reference voltage and a second scheme where the output of a comparator indicates a high level if the level of an analog signal to be converted is less than the reference voltage.

Figure 8:
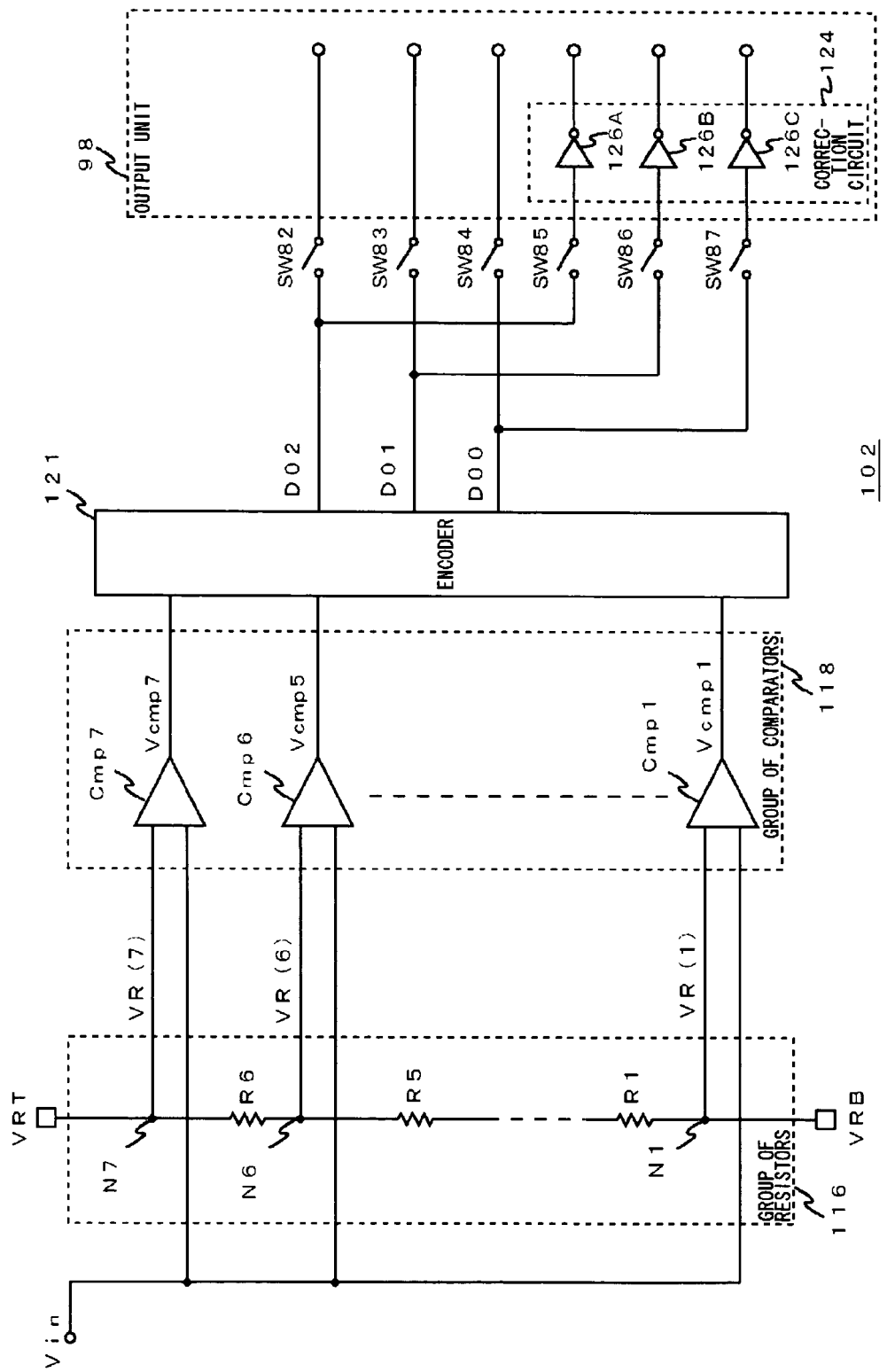
FIG. 8 is a circuit diagram showing a whole structure of an A-D converter according to a modification.

A description is given hereinbelow of a structure, as a modification to the present embodiments, in which the encoder is shared when the A-D converter performs different conversions even to the same number of bits. FIG. 8 is a circuit diagram showing a whole structure of an A-D converter 102 according to a modification. In FIG. 8, components identical or similar to those in FIG. 2 are given the same or like reference numerals as those of FIG. 2, and the explanation thereof will be omitted as appropriate.

The basic structure that the A-D converter 102 of FIG. 8 implements is the first scheme where the output of a comparator indicates a high level if the level of an analog signal to be converted is greater than the reference voltage. The encoder 121 is also used, in a shared manner, in a scheme where the output of a comparator indicates a high level if the level of an analog signal to be converted is less than the reference voltage.

The A-D converter 102 of FIG. 8 converts an analog signal Vin to a 3-bit digital value. Thus, the A-D converter 102 of FIG. 8 differs from the A-D converter 100 of FIG. 2 in that there are six resistors that constitute the group of resistors 116, there are seven comparators that constitute the group of comparators 118 and the binary code that the encoder 121 outputs is of 3 bits. Also, a correction circuit 124 is comprised of a first inverter 126A to a third inverter 126C. The first inverter 126A to the third inverter 126C are provided on paths of 3-bit binary codes (D02 to D00) outputted from the encoder 121, respectively.

Figure 9:
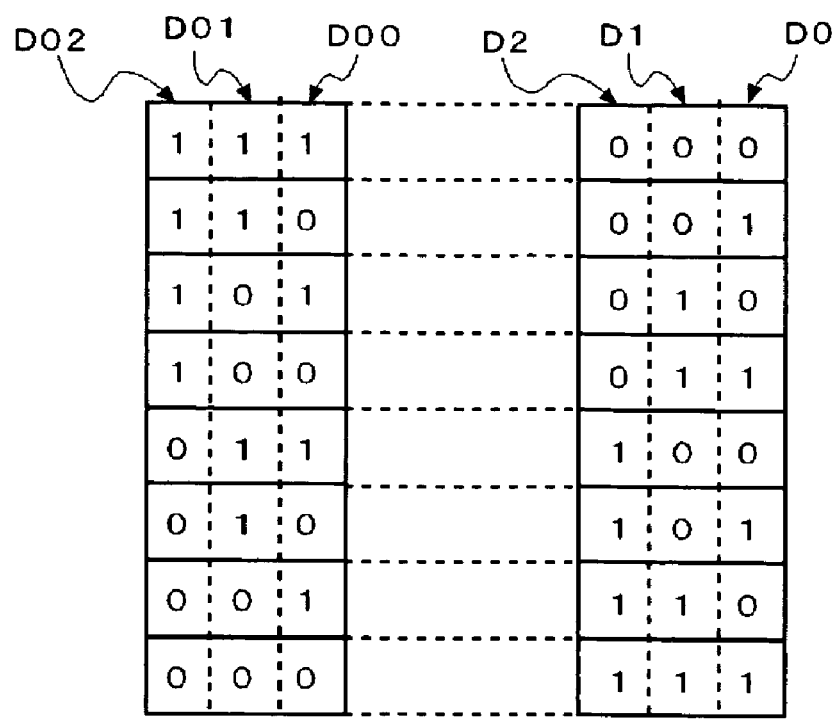
FIG. 9 illustrates a correspondence between a 3-bit binary code (D02 to D00) outputted from an encoder shown in FIG. 8 and a 3-bit binary code (D2 to D0) that the A-D converter shown in FIG. 8 is to generate in a second scheme.

FIG. 9 illustrates a correspondence between a 3-bit binary code (D02 to D00) outputted from an encoder 121 shown in FIG. 8 and a 3-bit binary code (D2 to D0) that the A-D converter 102 shown in FIG. 8 is to generate in a second scheme.

Referring to FIG. 9, it is shown that the inversion of the respective 3-bit binary codes (D02 to D00) results in the respective 3-bit binary codes (D2 to D0) that the A-D converter 102 is to generate in the second scheme. Thus, the correction circuit 124 is realized, as shown in FIG. 8, by the first inverter 126A to the third inverter 126C provided respectively on the 3-bit binary codes (D02 to D00).

According to this modification, an encoder can be shared even in the case where the A-D converter performs the conversion to the same number of bits under different schemes. As a result, the circuit scale of the A-D converter can be reduced and thereby the scope of application for the A-D converter according to the technique of the modification is further broadened.

Although in the present modification a description has been given of an example where the A-D converter 102 is to generate a 3-bit digital value, it goes without saying that the technique according to the present modification is also effective in a case where it is to generate a digital value of an arbitrary number of bits. It is obvious that if the present embodiments are combined with the present modification the encoder can be shared even in a case where the number of bits to be generated by the A-D converter differs and the conversion scheme in the A-D converter differs.

While the preferred embodiments of the present invention have been described using specific terms, such description is for illustrative purposes only, and it is to be understood that changes and variations may be made without departing from the spirit or scope of the appended claims.

What is claimed is:

1. An analog-to-digital converter, which converts an input analog signal to a digital value of a first number of bits, the analog-to-digital converter comprising:

a plurality of comparators, arranged in parallel, which each compares the input analog signal with a predetermined reference voltage wherein the number of comparators is determined based on the first number of bits;

an encoder which converts outputs of the plurality of comparators to digital values of the first number of bits; and an output unit which outputs the digital values converted by said encoder, wherein when said analog-to-digital converter is to convert the input analog signal to a digital value of a second number of bits which is less than the first number of bits, said output unit corrects the digital value converted by said encoder to the digital value of the second number of bits that said analog-to-digital converter is to generate.

2. An analog-to-digital converter according to claim 1, wherein the first number of bits is four, wherein the second number of bits is two, wherein said output unit includes an inverter which inverts a lower second bit in the digital value converted by said encoder, and said output unit outputs an output of the inverter and a value of the least significant bit in the digital value converted by said encoder, as the digital value of the second number of bits to be generated by said analog-to-digital converter.

3. An analog-to-digital converter comprising a plurality of comparators which each compares an input analog signal with a predetermined reference voltage;

an encoder which converts outputs of the plurality of comparators to digital values wherein said encoder is configured in response to a case where the analog signal and the predetermined reference voltage are inputted to the plurality of comparators, respectively, under a first scheme where the output of a comparator indicates a high level if the level of an analog signal to be converted is greater than the reference voltage; and a correction circuit which corrects the digital values converted by said encoder, in a case where the analog signal and the predetermined reference voltage are inputted to the plurality of comparators, respectively, under a second scheme that differs from the first scheme, where the output of a comparator indicates a high level if the level of an analog signal to be converted is less than the reference voltage, and wherein the levels of the respective outputs in the plurality of comparators are inverted between in a case where the analog signal and the predetermined reference voltage are inputted under the first scheme and a case where the analog signal and the predetermined reference voltage are inputted under the second scheme, and wherein said correction circuit includes an inverter which inverts the digital values converted by said encoder.

* * * * *